United States Patent
Su

(10) Patent No.: US 10,043,734 B2
(45) Date of Patent: Aug. 7, 2018

(54) METHOD AND DEVICE FOR VACUUM REACTING FORCE SOLDERING

(71) Applicant: GUANGZHOU LEDTEEN OPTOELECTRONICS CO., LTD, Guangzhou (CN)

(72) Inventor: Jiabing Su, Guangzhou (CN)

(73) Assignee: GUANGZHOU LEDTEEN OPTOELECTRONICS CO., LTD, Guangzhou (CN)

( * ) Notice: Subject to any disclaimer, the term of this patent is extended or adjusted under 35 U.S.C. 154(b) by 0 days.

(21) Appl. No.: 15/548,102

(22) PCT Filed: Sep. 23, 2015

(86) PCT No.: PCT/CN2015/090464
§ 371 (c)(1),
(2) Date: Aug. 2, 2017

(87) PCT Pub. No.: WO2017/049511
PCT Pub. Date: Mar. 30, 2017

(65) Prior Publication Data
US 2018/0033717 A1    Feb. 1, 2018

(51) Int. Cl.
| | | |
|---|---|---|
| B23K 1/008 | (2006.01) | |
| H01L 23/495 | (2006.01) | |
| B23K 3/02 | (2006.01) | |

(52) U.S. Cl.
CPC ........ H01L 23/49513 (2013.01); B23K 1/008 (2013.01); B23K 3/023 (2013.01);
(Continued)

(58) Field of Classification Search
CPC ...... B23K 1/005; B23K 1/0053; B23K 1/008; B23K 11/11; B23K 11/36; B23K 37/04; B23K 3/00
See application file for complete search history.

(56) References Cited

U.S. PATENT DOCUMENTS

| | | |
|---|---|---|
| 5,046,656 A | 9/1991 | Schmitt et al. |
| 5,297,480 A * | 3/1994 | Miyashita ............... B29C 33/02 100/320 |

(Continued)

FOREIGN PATENT DOCUMENTS

| | | |
|---|---|---|
| CN | 102528194 A | 7/2012 |
| CN | 103229604 A | 7/2013 |

(Continued)

*Primary Examiner* — Geoffrey S Evans
(74) *Attorney, Agent, or Firm* — Gokalp Bayramoglu

(57) ABSTRACT

The present invention discloses a vacuum reacting force soldering method, comprising the following steps: die-bonding a chip onto a substrate through soldering to form a semi-finished product; placing the semi-finished product into a vacuum eutectic cavity (6) of a vacuum eutectic stove; vacuum-pumping the vacuum eutectic cavity; preheating the vacuum eutectic cavity to slowly increase the temperature; heating the vacuum eutectic cavity quickly to melt the solder; applying an acting force to the vacuum eutectic cavity to accelerate a rise of the vacuum eutectic cavity after the vacuum eutectic cavity descends; performing forced refrigeration to the exterior of the vacuum eutectic cavity, while introducing a protective gas to the interior thereof; releasing the vacuum state of the vacuum eutectic cavity after the solder is solidified. This invention also discloses a soldering device using the vacuum reacting force eutectic soldering method described herein.

15 Claims, 3 Drawing Sheets

(52) U.S. Cl.
CPC ............ *H01L 2224/83805* (2013.01); *H01L 2924/01322* (2013.01)

(56) References Cited

U.S. PATENT DOCUMENTS

| | | |
|---|---|---|
| 5,632,434 A | 5/1997 | Evans et al. |
| 2015/0090768 A1* | 4/2015 | Kuroda ................. B23K 1/005 228/46 |

FOREIGN PATENT DOCUMENTS

| | | |
|---|---|---|
| EP | 0795891 A2 | 9/1997 |
| WO | WO-03/039799 A1 * | 5/2003 |
| WO | WO-2017049511 A1 * | 3/2017 |

* cited by examiner

METHOD AND DEVICE FOR VACUUM
REACTING FORCE SOLDERING

CROSS REFERENCE TO RELATED APPLICATIONS

This application is the national phase entry of International Application No. PCT/CN2015/090464, filed on Sep. 23, 2015, the entire contents of which are incorporated herein by reference.

TECHNICAL FIELD

The invention relates to a vacuum eutectic soldering device, specifically relates to a vacuum reacting force soldering method and device thereof.

BACKGROUND OF THE INVENTION

Eutectic soldering technology is widely applied in the field of microelectronics and optoelectronic packaging, such as the bonding of a chip and a substrate, bonding of the substrate and a housing, packaging a cover plate of the housing, etc. As a connection material of the devices, a solder joint is responsible for mechanical connections and electrical connections, heat exchanges, etc. Compared with the ordinary conductive adhesive bonding method, eutectic soldering technology with the advantages of high thermal conductivity, small resistance, high reliability, etc., is especially suitable for the connections between various high-power chips or high-frequency chips and substrates, substrates and housings. Power components which require high heat dissipation capability or high reliability of chips all adopt eutectic soldering, such as IGBT packaging, microwave power component, high power LED chip, laser diodes, multi-chip components, aerospace electronic device, etc. The main factors affecting the quality of eutectic soldering include a heating/cooling rate, a eutectic pressure, temperature uniformity, protective atmosphere, solder matching, etc. Improper handling of these factors easily leads to a thick intermetallic compound (IMC) layer, an uneven distribution of the intermetallic compound layer and a higher voiding rate, which would cause a potential reliability problem.

At present, the main eutectic soldering devices include infrared reflow furnace, eutectic machine with nozzles and tweezers, vacuum eutectic stove, etc. There are following deficiencies in the above equipment and process thereof:
(1) The infrared reflow furnace has the shortcomings of a slow heating/cooling rate, an uneven temperature zone and displacements of chips due to jitters in the transmission process.
(2) The eutectic machine with nozzles and tweezers has a low output, and easily causes damage to chips, especially photoelectric chips, and thus affects the product performance. Meanwhile, because of the eutectic chip by chip process, as to a multi-chip component, some eutectic chips which were performed eutectic first are subject to repeated heats, which leads to poor material performance of the chips. Further, melting of solder many times affects the life and performance of the soldering.
(3) The vacuum eutectic stove has a high heating/cooling rate, but in order to ensure the quality of eutectic, an additional fixture is usually used to apply a pressure on chips. It is suitable for larger chip packages while unsuitable for small chips and chips with fragile surfaces.

SUMMARY OF THE INVENTION

In order to overcome the shortcomings of the prior art, one objective of the present invention is to provide a vacuum reacting force soldering method, which is capable of applying an accelerating reacting force to the chip and effectively lowering the voiding rate of the solder joints on the premise of avoiding damage to the chip.

The second objective of the present invention is to provide a vacuum reacting force soldering device.

The first objective of the present invention is achieved by the following technical solutions:

A vacuum reacting force soldering method, comprising the following steps:
S1. die-bonding a chip onto a substrate through solder to form a semi-finished product;
S2. placing the semi-finished product into a vacuum eutectic cavity of a vacuum eutectic stove;
S3. vacuum-pumping the vacuum eutectic cavity;
S4. preheating the vacuum eutectic cavity to slowly increase a temperature;
S5. heating the vacuum eutectic cavity quickly to melt the solder;
S6. applying an acting force to the vacuum eutectic cavity to accelerate a rise of the vacuum eutectic cavity after the vacuum eutectic cavity descends;
S7. performing forced refrigeration to an exterior of the vacuum eutectic cavity, while introducing a protective gas to an interior of the vacuum eutectic cavity;
S8. releasing a vacuum state of the vacuum eutectic cavity after the solder is solidified.

Preferably, in the step S6, the vacuum eutectic cavity is first driven by a driving mechanism to accelerate to descend at an acceleration of a1, then decelerate to descend at an acceleration of a2, and then accelerate to rise at an acceleration of a3, and finally decelerate to rise at an acceleration of a4.

Preferably, the acceleration of a2 is greater than the acceleration of a1, the acceleration of a3 is greater than the acceleration of a4.

The second objective of the present invention is achieved by the following technical solutions:

A vacuum reacting force soldering device using the described vacuum reacting force eutectic soldering method, comprising a cabinet, a vacuum eutectic cavity for accommodating the semi-finished product to be soldered, a temperature raising system, a cooling system and a variable speed drive mechanism, the vacuum eutectic cavity is located inside the cabinet and slides with respect to the cabinet in a vertical direction; the variable speed drive mechanism is installed in the cabinet and is connected to the vacuum eutectic cavity to drive the vacuum eutectic cavity and is used to actuate the vacuum eutectic cavity to move in the vertical direction at a variable speed; the temperature raising system is disposed inside the vacuum eutectic cavity, and the cooling system is disposed inside the cabinet and located outside the vacuum eutectic cavity.

Preferably, the vacuum eutectic cavity comprises a metallic cavity and a vacuum device, the wall of the metallic cavity is provided with a gas hole which is connected to the vacuum device through a vacuum pipe.

Preferably, the bottom of the vacuum eutectic cavity is provided with a slot for accommodating the semi-finished product to be soldered, and the bottom of the vacuum eutectic cavity on the outer side of the slot is connected to a retaining washer to fix the semi-finished product to be soldered by a screw thread connection.

Preferably, the temperature raising system comprises a heating plate and an infrared heating tube, the heating plate is embedded in the bottom of the vacuum eutectic cavity, and the infrared heating tube is fixed to the top of the vacuum eutectic cavity. Preferably, an openable insulation housing is provided around the vacuum eutectic cavity and encloses the vacuum eutectic cavity.

Preferably, the cooling system comprises a radiator, an air cooler for blowing air to the vacuum eutectic cavity and an air cooling device for injecting cryogenic gas into the vacuum eutectic cavity, the radiator is connected to the bottom and outside of the vacuum eutectic cavity, and the air cooler and the air cooling device are both installed in the cabinet and outside the vacuum eutectic cavity.

Preferably, the cabinet further comprises a support, a sliding rail, and a slider, and the variable speed drive mechanism is a linear motor, the output end of the linear motor is connected to the support, the vacuum eutectic cavity is connected to the slider through the support, the slider slides with respect to the sliding rail fixed in the cabinet.

Compared with the prior art, the present invention has the following beneficial effects:

In the invention, a fast temperature increasing and decreasing, a vacuum and high pressure are used. Since the intermetallic compound layer is closely related to the solder compositions and the heating/cooling rate curve, the eutectic solder can achieve the best soldering effect by quickly heating and annealing. Further, the solder voids are usually formed by an oxide film on the surface of the solder, dust particles, and bubbles that are not discharged at the time of melting. The present invention adopts the measures of vacuuming and applying a pressure on the chip. Especially in the process of pressurization, a principle of overweight is used, namely, the reaction force generated by the acceleration puts a pressure on the semi-finished product. Hence, there is no damage to the chip caused by an external pressure. Therefore, a good result can be achieved, while the reliability of the device is improved and the voiding rate of the soldering spot is effectively reduced.

In addition, the chips, solder and substrate must be heated and cooled repeatedly in the traditional technology of the soldering process. For the earliest soldered chip, the process has to be repeated until the entire board is soldered. In the process, there are reliability risks of chip damages, formation of solder voids, chip displacements etc. In the invention, dozens of chips in the vacuum eutectic cavity can be soldered at the same time, compared with the one-by-one mode of the traditional pressurized eutectic soldering process, the present invention can effectively solve the above problems while increasing the production efficiency dozens of times.

Wherein, 1—base, 2—cabinet body, 3—safety gate, 4—status indicator, 5—touch screen, 6—vacuum eutectic cavity, 601—slot, 602—retaining washer, 603—gas hole, 7—heating plate, 8—infrared heating tube, 9—radiator, 10—air cooling device, 11—insulating housing, 12—linear motor, 13—sliding rail, 1301—slider, 14—support frame, 15—support, 16—semi-finished product.

DETAILED DESCRIPTION OF THE INVENTION

The invention will now be described further below with reference to attached drawings and specific embodiments thereof, A vacuum reacting force soldering method, comprising the following steps:
S1. die-bonding a chip onto a substrate through solder to form a semi-finished product;
S2. placing the semi-finished product into a vacuum eutectic cavity of a vacuum eutectic stove;
S3. vacuum-pumping the vacuum eutectic cavity;
S4. preheating the vacuum eutectic cavity to slowly increase the temperature;
S5. heating the vacuum eutectic cavity quickly to melt the solder;
S6. applying an acting force to the vacuum eutectic cavity to accelerate a rise of the vacuum eutectic cavity after the vacuum eutectic cavity descends;
S7. performing forced refrigeration to the exterior of the vacuum eutectic cavity, while introducing a protective gas to the interior thereof;
S8. releasing the vacuum state of the vacuum eutectic cavity after the solder is solidified.

Figure 5:
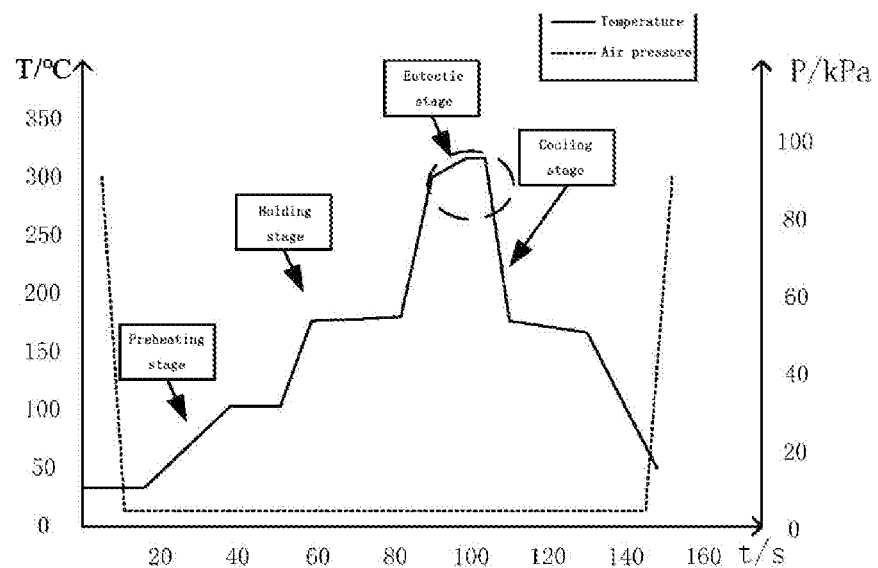
FIG. 5 is a schematic diagram showing a relationship of the temperature, the vacuum degree and the time in a vacuum reacting force soldering device.

An insulation housing may be provided outside the vacuum eutectic cavity for the thermal insulation of the vacuum eutectic cavity during heating. In the above-mentioned step S3, it is possible to determine whether or not a protective atmosphere or a reducing atmosphere is added depending on the actual situation. In step S4, the temperature is uniformly raised by the temperature raising system, so that the temperature distribution of the system is uniform. And the temperature rise curve is shown in FIG. 5. The temperature is gradually raised to a certain holding stage. In step S5 of this embodiment, it is set to go into a rapid heating stage (the eutectic stage shown in FIG. 5) when the temperature exceeds 180° C. The temperature of the vacuum eutectic cavity is rapidly raised to above 300° C., the solder melts and enters the wetting stage (defined as the process by which a uniform, smooth, continuous alloy of molten solder is formed and attached firmly on the surface of the metal.). To get a high quality solder joint, the liquid solder must be filled within the entire solder gap to ensure the soldering quality.

Figure 6:
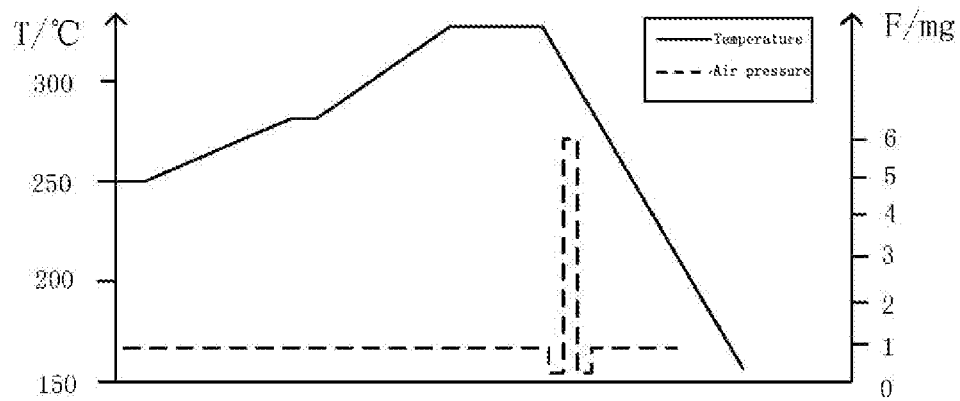
FIG. 6 is a schematic diagram showing a relationship of the temperature of eutectic segment, the interaction force between the chip and the substrate.

In step S6, the operation of accelerating a rise of the vacuum eutectic cavity after the vacuum eutectic cavity descends is aimed to make the semi-finished product in an overweight state. As the semi-finished product is overweight, as shown in FIG. 6, the temperature curve starts to drop rapidly. At the same time, because of the acceleration and deceleration movements of the vacuum eutectic cavity, the chip generates a reaction force against the substrate to form a pressure. At the temperature point when the solder is solidified, the chip is pressed against the substrate by a higher pressure due to the severe overweight, allowing the chip, the solder and the substrate to be tightly connected, while contributing to the reduction of the voiding rate of the solder joint and optimizing the soldering effect. In step S7, the vacuum eutectic cavity can be forcedly cooled by the cooling system.

As a preferred embodiment, in the step S6, the vacuum eutectic cavity is first driven by a driving mechanism to accelerate to descend at an acceleration of a1, then decelerate to descend at an acceleration of a2, and then accelerate to rise at an acceleration of a3, and finally decelerate to rise at an acceleration of a4. Wherein, the acceleration of a2>the acceleration of a1, the acceleration of a3>the acceleration of a4.

Figure 7:
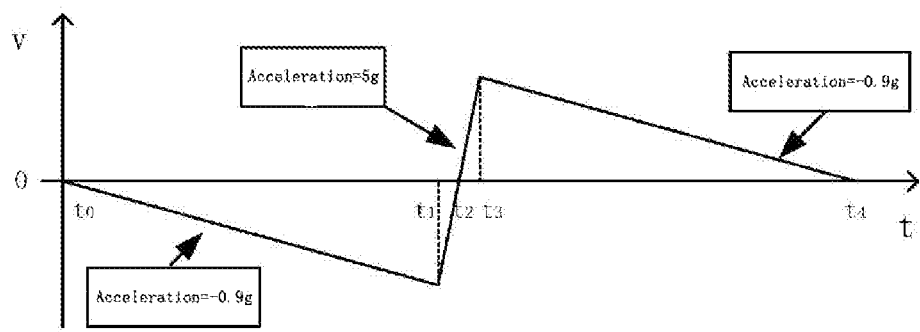
FIG. 7 is a schematic diagram showing the acceleration changes of a vacuum reacting force soldering device.

In this embodiment, the acceleration of the vacuum eutectic cavity driven by the driving mechanism is shown in FIG. 7. In the time interval $t_0$-$t_1$, the vacuum eutectic cavity accelerates downward at an acceleration of about 0.9 G (G=9.8 m/s$^2$). The chip is in a slight weightless state, but does not affect the combination of the chip and the substrate (the pressure exerted by the chip on the solder and the substrate is about 0.1 mG, m is the chip weight). In the time interval $t_1$-$t_2$, the vacuum eutectic cavity decelerates downward to the lowest point at an acceleration of about 5 G. The chip is in a serious overweight state and exerts a pressure on the solder and substrate (the pressure exerted by the chip on the solder and substrate is about 6 mG). In the time interval $t_2$-$t_3$, the vacuum eutectic cavity accelerates upward at an acceleration of about 5 G, the chip is in a serious overweight state and exerts a pressure on the solder and substrate (the pressure exerted by the chip on the solder and the substrate is about 6 mG). In the time interval $t_3$-$t_4$, the vacuum eutectic cavity decelerates upward at an acceleration of about 0.9 G till the vacuum eutectic cavity goes back and stops in situ. The chip is in a slight weightless state (the pressure exerted by the chip on the solder and the substrate is about 0.1 mG).

At the same time as the vacuum eutectic cavity moves at an acceleration of 5 G, the cooling system is started to rapidly cool the vacuum eutectic cavity.

As shown in FIGS. 1 to 5, a vacuum reaction force soldering device using a vacuum reaction force soldering method comprises a cabinet, a vacuum eutectic cavity 6 for accommodating the semi-finished product 16 to be soldered, a temperature raising system, a cooling system and a variable speed drive mechanism. The vacuum eutectic cavity 6 is located inside the cabinet and slides with respect to the cabinet in a vertical direction; the variable speed drive mechanism is installed in the cabinet and is connected to the vacuum eutectic cavity to drive the vacuum eutectic cavity 6 and is used to actuate the vacuum eutectic cavity 6 to move in the vertical direction at a variable speed. The temperature raising system is disposed inside the vacuum eutectic cavity 6, and the cooling system is disposed inside the cabinet and located outside the vacuum eutectic cavity 6.

The vacuum eutectic cavity 6 is driven by the variable speed drive mechanism to perform a variable speed movement in the cabinet so that the chip on the semi-finished product 16 to be soldered exerts a reaction pressure on the substrate to allow the chip, the solder and the substrate to be tightly connected, while the pressure contributes to a reduction of the voiding rate of the solder joint. During this period, under the effects of the temperature raising system and the cooling system, the solder achieves the best soldering effect through a rapid temperature rise and annealing.

Figure 1:
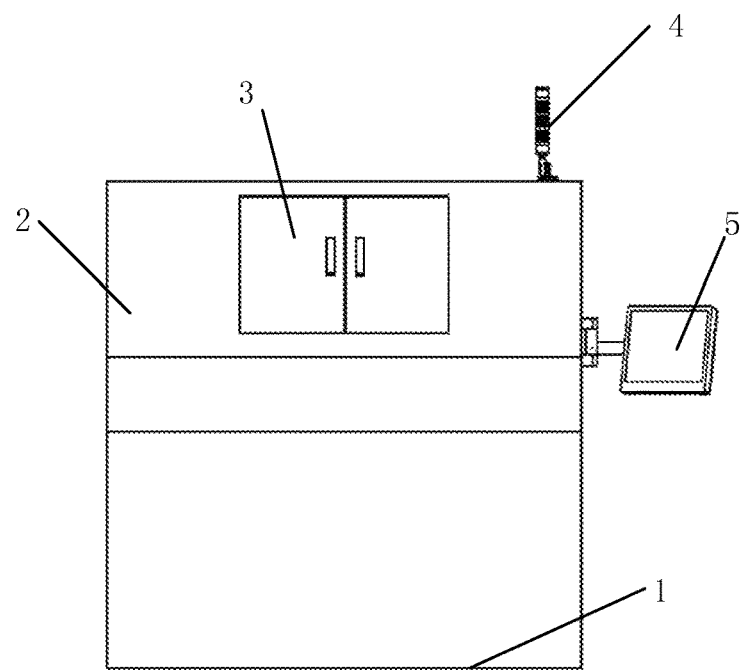
FIG. 1 is a schematic diagram of a cabinet of a vacuum reacting force soldering device.

As shown in FIG. 1, the cabinet of this embodiment comprises a base 1, a housing 2, a safety gate 3, a status indicator light 4, and a touch screen 5. The base 1 is located at the bottom of the housing 2 for supporting the entire soldering device. The housing 2 is located on the base 1 for protecting the internal structure of the soldering device and isolating the internal heat. The safety gate 3 is located on the front side of the housing 2, and the housing 2 can be opened and closed by push-pull mode. The status indicator light 4 is located above the housing 2 for indicating the operating condition of the device. The touch screen 5 is located on the side of the housing 2 for inputting an operation control command. The rear of the housing 2 can be equipped with a cooling fan for heat dissipation inside the soldering device.

Figure 4:
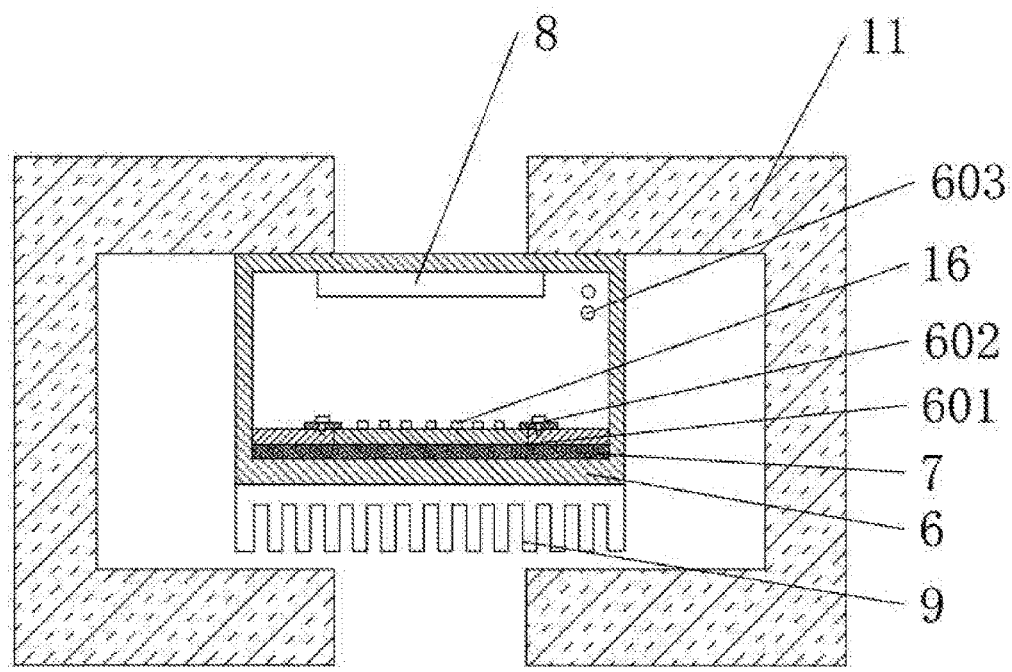
FIG. 4 is a diagram showing a cooperation between a vacuum eutectic cavity and insulating housing in a vacuum reacting force soldering device.

As shown in FIG. 4, the vacuum eutectic cavity 6 of this embodiment comprises a metallic cavity and a vacuum device, and the wall of the metallic cavity is provided with gas holes 603, which are connected to the vacuum device through a vacuum pipe. In particular, the metallic cavity may be composed of a semi-closed cavity in combination with a metal sealing cap, which conforms to the opening shape of the semi-closed cavity for sealing the vacuum eutectic chamber 6. The vacuum system comprises a vacuum pump, a vacuum pipe, a gas tank and a vacuum valve, and the vacuum system is placed outside the vacuum eutectic cavity 6 and connected to the gas holes 603 through a vacuum conduit for evacuating the vacuum eutectic cavity 6. As shown in FIG. 4, the bottom of the vacuum eutectic cavity 6 is provided with a slot 601 for accommodating the semi-finished product 16 to be soldered. The bottom of the vacuum eutectic cavity 6 on the outer side of the slot 601 is connected to retaining washers 602 to fix the semi-finished product 16 to be soldered by a screw thread connection. The shape and the size of the slot 601 coincide with those of the semi-finished product 16 to be soldered, so as to position the semi-finished product 16, and so that the retaining washers 602 can lock and fix the semi-finished product 16 to be soldered.

As shown in FIG. 4, the temperature raising system of this embodiment comprises a heating plate 7 and an infrared heating tube 8, the heating plate 7 is embedded in the bottom of the vacuum eutectic cavity 6, and the infrared heating tube 8 is fixed to the top of the vacuum eutectic cavity 6. The heating plate 7 is heated in an electrothermal heating mode, so that the vacuum eutectic chamber 6 is rapidly heated from bottom to top. The infrared heating tube 8 heated in an infra-red heating mode rapidly heats the vacuum eutectic chamber 6 from bottom to top.

As shown in FIG. 4, an openable insulation housing 11 for a heat insulation when heating is provided around the vacuum eutectic cavity 6 and encloses the vacuum eutectic cavity 6. When the vacuum eutectic cavity 6 needs to be moved, the insulation housing 11 is opened and the vacuum eutectic cavity 6 can be removed from the insulation housing 11. The insulation housing 11 may be joined by two half-shells, and driven by an external cylinder to open or close.

Figure 2:
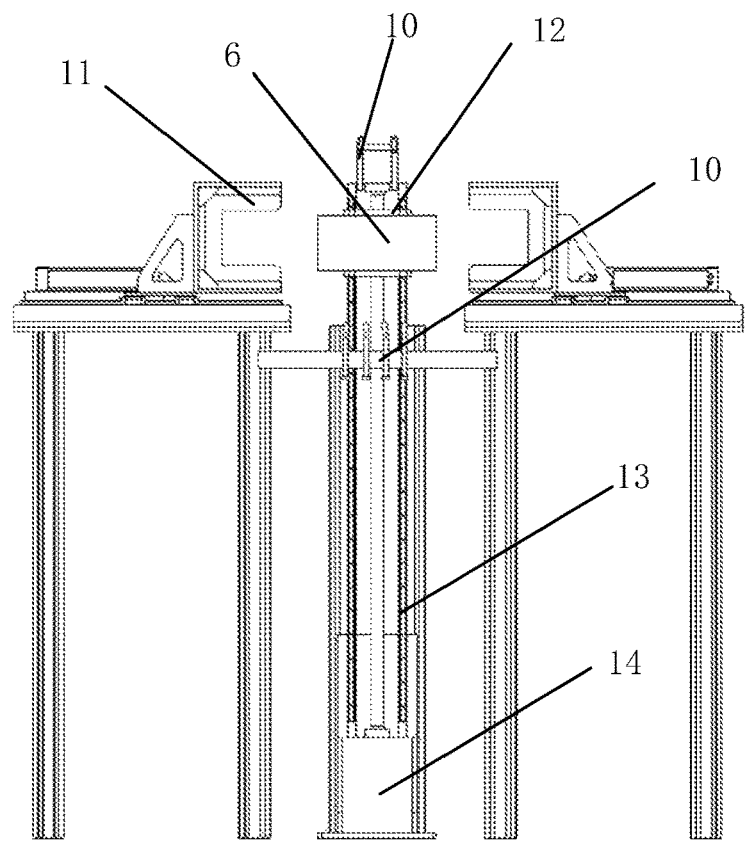
FIG. 2 is a schematic front view inside the cabinet of a vacuum reacting force soldering device.

As shown in FIGS. 2 and 4, the cooling system of this embodiment comprises a radiator 9, an air cooler for blowing air into the vacuum eutectic cavity 6 and an air cooling device for injecting cryogenic gas into the vacuum eutectic cavity 6. The radiator 9 is connected to the bottom and outside of the vacuum eutectic cavity 6, the air cooler and the air cooling device are both installed in the cabinet and outside the vacuum eutectic cavity 6. The radiator 9 can directly dissipate heat from the vacuum eutectic cavity 6, the air cooler can use a fan to accelerate the air flow to dissipate the heat from the vacuum eutectic cavity 6, and the air cooling device can dissipate heat from the vacuum cavity by a direct injection of the low-temperature gas.

Figure 3:
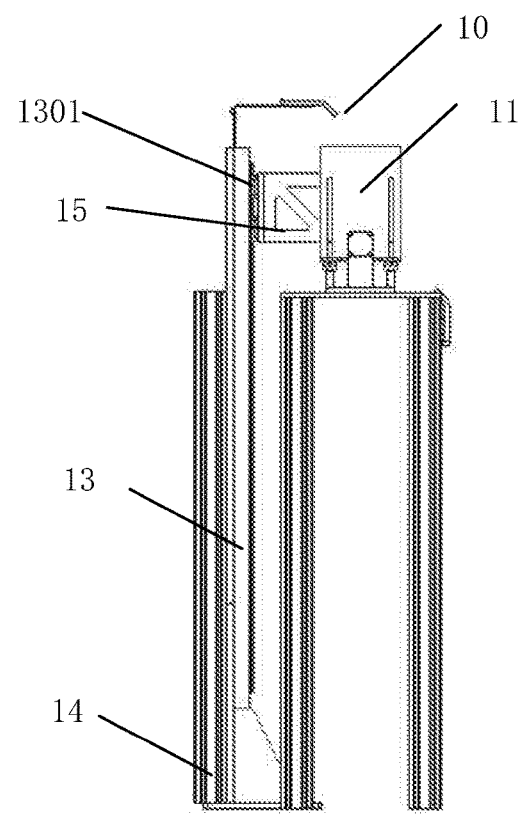
FIG. 3 is a schematic side view of inside the cabinet of a vacuum reacting force soldering device.

As shown in FIGS. 2 and 3, in order to realize a steady variable speed movement of the vacuum eutectic cavity 6, the cabinet further comprises a support 15, a sliding rail 13, and a slider 1301. The variable speed drive mechanism is a linear motor 12. The output end of the linear motor 12 is connected to the support 15, the vacuum eutectic cavity 6 is connected to the slider 1301 through the support 15, and the slider 1301 slides with respect to the sliding rail 13 fixed in the cabinet. The linear motor 12 is placed vertically for generating a vertical acceleration up and down. The sliding rail 13 and the slider 1301 are provided on the left and right sides of the linear motor 12 to enhance the stability. The sliding rail 13 can be fixed in the housing through a support frame 14.

In addition, the PLC control system can be added to control the logic, movement and process of the vacuum reaction force soldering device by controlling the vacuum pump and the on-off valve of the vacuum system, the temperature controllers of the temperature raising system and the cooling system, and the servo driver of the linear motor 12.

It will be apparent for those skilled in the art that various changes and modifications may be made in accordance with the technical solutions and concepts described above, and that all such changes and modifications are intended to fall within the scope of the appended claims.

What is claimed is:

1. A vacuum reacting force soldering method, comprising the following steps:
    S1. die-bonding a chip onto a substrate through solder to form a semi-finished product;
    S2. placing the semi-finished product into a vacuum eutectic cavity of a vacuum eutectic stove;
    S3. vacuum-pumping the vacuum eutectic cavity;
    S4. preheating the vacuum eutectic cavity to slowly increase a temperature;
    S5. heating the vacuum eutectic cavity quickly to melt the solder;
    S6. applying an acting force to the vacuum eutectic cavity to accelerate a rise of the vacuum eutectic cavity after the vacuum eutectic cavity descends;
    S7. performing forced refrigeration to an exterior of the vacuum eutectic cavity, while introducing a protective gas to an interior of the vacuum eutectic cavity;
    S8. releasing a vacuum state of the vacuum eutectic cavity after the solder is solidified.

2. The vacuum reacting force soldering method of claim 1, wherein in the step S6, the vacuum eutectic cavity is first driven by a driving mechanism to accelerate to descend at an acceleration of a1, then decelerate to descend at an acceleration of a2, and then accelerate to rise at an acceleration of a3, and finally decelerate to rise at an acceleration of a4.

3. The vacuum reacting force soldering method of claim 2, wherein the acceleration of a2 is greater than the acceleration of a1, the acceleration of a3 is greater than the acceleration of a4.

4. A vacuum reacting force soldering device comprising a cabinet, a vacuum eutectic cavity for accommodating the semi-finished product to be soldered, a temperature raising system, a cooling system and a variable speed drive mechanism, the vacuum eutectic cavity is located inside the cabinet and slides with respect to the cabinet in a vertical direction; the variable speed drive mechanism is installed in the cabinet and is connected to the vacuum eutectic cavity to drive the vacuum eutectic cavity and is used to actuate the vacuum eutectic cavity to move in the vertical direction at a variable speed; the temperature raising system is disposed inside the vacuum eutectic cavity, and the cooling system is disposed inside the cabinet and located outside the vacuum eutectic cavity.

5. The vacuum reacting force soldering device of claim 4, wherein the vacuum eutectic cavity comprises a metallic cavity and a vacuum device, a wall of the metallic cavity is provided with a gas hole, and the gas hole is connected to the vacuum device through a vacuum pipe.

6. The vacuum reacting force soldering device of claim 5, wherein the cabinet further comprises a support, a sliding rail, and a slider, and the variable speed drive mechanism is a linear motor, an output end of the linear motor is connected to the support, the vacuum eutectic cavity is connected to the slider through the support, the slider slides with respect to the sliding rail fixed in the cabinet.

7. The vacuum reacting force soldering device of claim 5, wherein a bottom of the vacuum eutectic cavity is provided with a slot for accommodating the semi-finished product to be soldered, and the bottom of the vacuum eutectic cavity on the outer side of the slot is connected to a retaining washer to fix the semi-finished product to be soldered by a screw thread connection.

8. The vacuum reacting force soldering device of claim 7, wherein the cabinet further comprises a support, a sliding rail, and a slider, and the variable speed drive mechanism is a linear motor, an output end of the linear motor is connected to the support, the vacuum eutectic cavity is connected to the slider through the support, the slider slides with respect to the sliding rail fixed in the cabinet.

9. The vacuum reacting force soldering device of claim 4, wherein the temperature raising system comprises a heating plate and an infrared heating tube, the heating plate is embedded in a bottom of the vacuum eutectic cavity, and the infrared heating tube is fixed to a top of the vacuum eutectic cavity.

10. The vacuum reacting force soldering device of claim 9, wherein the cabinet further comprises a support, a sliding rail, and a slider, and the variable speed drive mechanism is a linear motor, an output end of the linear motor is connected to the support, the vacuum eutectic cavity is connected to the slider through the support, the slider slides with respect to the sliding rail fixed in the cabinet.

11. The vacuum reacting force soldering device of claim 9, wherein an openable insulation housing is provided around the vacuum eutectic cavity.

12. The vacuum reacting force soldering device of claim 11, wherein the cabinet further comprises a support, a sliding rail, and a slider, and the variable speed drive mechanism is a linear motor, an output end of the linear motor is connected to the support, the vacuum eutectic cavity is connected to the slider through the support, the slider slides with respect to the sliding rail fixed in the cabinet.

13. The vacuum reacting force soldering device of claim 4, wherein the cooling system comprises a radiator, an air cooler for blowing air to the vacuum eutectic cavity, and an air cooling device for injecting a cryogenic gas into the vacuum eutectic cavity, the radiator is connected to a bottom and outside of the vacuum eutectic cavity, and the air cooler and the air cooling device are both installed in the cabinet and outside the vacuum eutectic cavity.

14. The vacuum reacting force soldering device of claim 13, wherein the cabinet further comprises a support, a sliding rail, and a slider, and the variable speed drive mechanism is a linear motor, an output end of the linear motor is connected to the support, the vacuum eutectic cavity is connected to the slider through the support, the slider slides with respect to the sliding rail fixed in the cabinet.

15. The vacuum reacting force soldering device of claim 4 wherein the cabinet further comprises a support, a sliding rail, and a slider, and the variable speed drive mechanism is a linear motor, an output end of the linear motor is connected to the support, the vacuum eutectic cavity is connected to the slider through the support, the slider slides with respect to the sliding rail fixed in the cabinet.

* * * * *